(12) United States Patent
Werner et al.

(10) Patent No.: US 7,919,010 B2
(45) Date of Patent: Apr. 5, 2011

(54) DOPED ORGANIC SEMICONDUCTOR MATERIAL

(75) Inventors: Ansgar Werner, Dresden (DE); Horst Hartmann, Dresden (DE); Fenghong Li, Etobicoke (CA); Martin Pfeiffer, Dresden (DE); Karl Leo, Dresden (DE)

(73) Assignee: Novaled AG, Dresden (DE)

( * ) Notice: Subject to any disclaimer, the term of this patent is extended or adjusted under 35 U.S.C. 154(b) by 1049 days.

(21) Appl. No.: 11/315,072

(22) Filed: Dec. 22, 2005

(65) Prior Publication Data

US 2007/0145355 A1 Jun. 28, 2007

(51) Int. Cl.
C30B 15/00 (2006.01)

(52) U.S. Cl. ......... 252/301.16; 252/182.11; 252/301.25; 257/40; 438/99

(58) Field of Classification Search .............. 252/301.16
See application file for complete search history.

(56) References Cited

U.S. PATENT DOCUMENTS

| | | | |
|---|---|---|---|
| 2,566,208 A | 8/1951 | Jenkins | |
| 3,083,242 A | 3/1963 | Ramsden | |
| 3,226,450 A | 12/1965 | Blazejak et al. | |
| 3,558,671 A | 1/1971 | Martin | |
| 3,563,751 A * | 2/1971 | Cohen | 430/332 |
| 4,003,943 A | 1/1977 | Fukunaga | |
| 4,066,569 A | 1/1978 | Lim | |
| 4,133,821 A | 1/1979 | West et al. | |
| 4,618,453 A | 10/1986 | Kim | |
| 4,960,916 A | 10/1990 | Pazik et al. | |
| 5,093,698 A | 3/1992 | Egusa | |
| 5,110,835 A | 5/1992 | Walter et al. | |
| 5,247,226 A | 9/1993 | Sato et al. | |
| 5,281,730 A | 1/1994 | Zambounis et al. | |
| 5,292,881 A | 3/1994 | Berneth et al. | |
| 5,393,614 A | 2/1995 | Nakada | |
| 5,556,524 A | 9/1996 | Albers | |
| 5,811,833 A | 9/1998 | Thompson | |
| 5,840,217 A | 11/1998 | Lupo et al. | |
| 5,922,396 A | 7/1999 | Thompson et al. | |
| 6,013,384 A | 1/2000 | Kido et al. | |
| 6,013,982 A * | 1/2000 | Thompson et al. | 313/506 |
| 6,103,459 A | 8/2000 | Diel et al. | |
| 6,207,835 B1 | 3/2001 | Reiffenrath et al. | |
| 6,350,534 B1 | 2/2002 | Boerner et al. | |
| 6,423,429 B2 | 7/2002 | Kido et al. | |
| 6,524,728 B1 | 2/2003 | Kijima et al. | |
| 6,700,058 B2 | 3/2004 | Nelles et al. | |
| 6,747,287 B1 | 6/2004 | Toguchi et al. | |
| 6,824,890 B2 | 11/2004 | Bazan et al. | |
| 6,908,783 B1 | 6/2005 | Kuehl et al. | |
| 6,972,334 B1 | 12/2005 | Shibanuma et al. | |
| 7,081,550 B2 | 7/2006 | Hosokawa et al. | |
| 7,345,300 B2 | 3/2008 | Qin | |
| 2003/0064248 A1 | 4/2003 | Wolk | |
| 2003/0165715 A1 | 9/2003 | Yoon et al. | |
| 2003/0234397 A1 | 12/2003 | Schmid et al. | |
| 2004/0068115 A1 | 4/2004 | Lecloux et al. | |
| 2004/0076853 A1 * | 4/2004 | Jarikov | 428/690 |
| 2005/0040390 A1 | 2/2005 | Pfeiffer et al. | |
| 2005/0061232 A1 * | 3/2005 | Werner et al. | 117/19 |
| 2005/0072971 A1 | 4/2005 | Marrocco et al. | |
| 2005/0086251 A1 | 4/2005 | Hatscher et al. | |
| 2005/0110009 A1 | 5/2005 | Blochwitz-Nimoth et al. | |
| 2005/0121667 A1 | 6/2005 | Kuehl et al. | |
| 2006/0049397 A1 | 3/2006 | Pfeiffer et al. | |
| 2007/0026257 A1 * | 2/2007 | Begley et al. | 428/690 |
| 2007/0058426 A1 | 3/2007 | Sokolik et al. | |
| 2007/0090371 A1 | 4/2007 | Drechsel et al. | |
| 2007/0116984 A1 | 5/2007 | Park et al. | |
| 2007/0252140 A1 | 11/2007 | Limmert et al. | |
| 2008/0103315 A1 | 5/2008 | Egawa et al. | |
| 2008/0122345 A1 | 5/2008 | Sakata et al. | |
| 2008/0145708 A1 * | 6/2008 | Heil et al. | 428/704 |
| 2008/0265216 A1 | 10/2008 | Hartmann et al. | |
| 2009/0001327 A1 | 1/2009 | Werner et al. | |

FOREIGN PATENT DOCUMENTS

| | | |
|---|---|---|
| CA | 2549309 | 9/2005 |
| CH | 354065 | 5/1961 |
| CH | 354066 | 5/1961 |
| DE | 19836408 | 2/2000 |
| DE | 103 07 125 A1 | 1/2004 |
| DE | 10261662 | 7/2004 |
| EP | 1000998 | 5/2000 |
| JP | 61254582 | 11/1986 |
| JP | 63172274 | 7/1988 |
| JP | 63172275 | 7/1988 |
| JP | 04338760 | 11/1992 |
| JP | 7168377 | 7/1995 |
| JP | 2004010703 | 1/2004 |
| JP | 2004335557 | 11/2004 |
| WO | WO 03/088271 A1 | 10/2003 |
| WO | WO 03/104237 | 12/2003 |
| WO | 2006067800 | 6/2006 |

(Continued)

OTHER PUBLICATIONS

Fuxi Gan "Optical Nonlinearity of Hybrid and Nanocomposite Material Prepared by the Sol-Gel Method" Journal of Sol-Gel Science and Technology 13, 559-563 (1998).*

Pfeiffer et al. "Doped organic semiconductors: Physics and application in light emitting diodes" Organic Electronics, Elsevier, vol. 4, No. 2/3, Sep. 2003, pp. 89-103, xp001177135 ISSN: 1566-1199.*

Electroluminescence from two fluorinated organic emitters embedded in polyvinyl carbazole, Giovanella et al., Oct. 18, 2005, Applied Physics Letters, vol. 87, 171910-1-171910-3.*

Vaid et al., Investigations of the 9,10-Diphenylacridyl Radical as an Isostructural Dopant for the Molecular Semiconductor 9,10-Diphenylanthracene, Chem. Mater. 2003, 15, 4292-4299.*

Von Jurgen Kauphold, Ber. Bunsen. Phys. Chem. 69, pp. 168-179.

D. Oeter et al., Doping and stability of ultrapure α-oligothiophene thin films, Synthetic Metals, 61, 1993, pp. 147-150.

(Continued)

*Primary Examiner* — Harold Y Pyon
*Assistant Examiner* — Timothy Chiang
(74) *Attorney, Agent, or Firm* — Sutherland, Asbill & Brennan LLP

(57) ABSTRACT

The present invention relates to a doped organic semiconductor material comprising an organic matrix material which is doped with at least one heteromonocyclic and/or heteropolycyclic compound, the compound having at least one nitrogen atom with a free electron pair.

14 Claims, No Drawings

FOREIGN PATENT DOCUMENTS

WO    WO 2008/022633    2/2008

OTHER PUBLICATIONS

G. D. Sharma et al., Influence of iodine on the electrical and photoelectrical properties of zinc phthalocyanine think film devices, Materials Science and Engineering B41, 1996, pp. 222-227.

Junji Kido et al., Bright organic electroluminescent devices having a metal-doped electron-injecting layer, Applied Physics Letters, vol. 73, No. 20, Nov. 16, 1998, pp. 2866-2868.

M. Maitrot et al., Molecular material based junctions: Formation of a Schottky contact with metallophthalocyanine thin films doped by the cosubllmation method, J. Applied Physics, 60 (7), Oct. 1, 1986, pp. 2396-2400.

Stephen F. Nelsen, Heterocyclic Radical Anions. II. Naphthalic and 1,4,5,8-Naphthalenetetracarboxylic Acid Derivatives, Journal of the American Chemical Society, 89:23, Nov. 8, 1967, pp. 5925-5931.

Parker, On the Problem of Assigning Values to Energy Changes of Electrode Reactions, Journal of the American Chemical Society, 96:17, Aug. 21, 1974, pp. 5656-5661.

M. Pfeiffer et al., Controlled doping of phthalocyanine layers by cosublimation with acceptor molecules: A systematic Seebeck and conductivity study, Applied Physics Letters, vol. 73, No. 22, Nov. 20, 1998, pp. 3202-3204.

Tong B. Tang et al., Ionization thresholds of merocyanine dyes in the solid state, Journal Applied Physics, vol. 59, (1), Jan. 1986, pp. 5-10.

X. Zhou et al., Very-low-operating voltage organic light-emitting diodes using a p-doped amorphous hole injection layer, Applied Physics Letters, vol. 78, No. 4, Jan. 22, 2001, pp. 410-412.

G. Klopman, chemical Reactivity and the Concept of Charge- and Frontier-Controlled Reactions, J. Amer. Chem. Soc., vol. 90, No. 2, Jan. 17, 1968, pp. 223-234.

S. Hamm, Rectifying organic junctions of molecular assemblies based on perylene ion salts, J. Chem. Phys., vol. 103, No. 24, Dec. 22, 1995, pp. 10689-10695.

W. B. Jensen, The Generalized Lewis Acid-Based Concepts, John Wiley & Sons, New York, 1980, pp. 113-195.

J.D. Anderson et al., Electrochemistry and Electrogenerated Chemiluminescence Processes of the Components of Aluminum Quinolate/Triarylamine, and Related Organic Light-Emitting Diodes, J. Am. Chem.. Soc. 1998, 120, pp. 9646-9655.

B. W. D'Andrade et al., Relationship between the ionization and oxidation potentials of molecular organic semiconductors, Organic Electronics 6, 2005, pp. 11-20.

C. W. Tang et al., Organic electroluminescent diodes, Applied Physics Letters, vol. 51, No. 12, Sep. 21, 1987, pp. 913-915.

Jun Endo et al., Organic Electroluminescent Devices with a Vacuum-Deposited Lewis-Acid-Doped Hole-Injecting Layer, Japan Society of Applied Physics, vol. 41, 2002, pp. L358-L360, Part 2, No. 3B, Mar. 15, 2002.

Yao Fu et al., Quantum-Chemical Predictions of Absolute Standard Redox Potentials of Diverse Organic Molecules and Free Radicals in Acetonitrile, J. Am. Chem. Soc. 2005, 127, pp. 7227-7234.

Chimed Ganzorig et al., $p$-Type Semiconducts of Aromatic Diamies Doped with $SbCl_5$, Chemistry Letters 2000, pp. 1032-1033.

R. C. Haddon et al., Conducting films of $C_{60}$ and $C_{70}$ by alkali-metal doping, Nature, vol. 350, Mar. 28, 1991, pp. 320-322.

R. Schlaf et al., HOMO/LUMO Alignment at PTCDA/ZnPc and PTCDA/ClInPc Heterointerfaces Determined by Combined UPS and XPS Measurements, J. Phys. Chem. B 1999, 103, pp. 2984-2992.

Weiying Gao et al., Effect of electrical doping on molecular level alignment at organic-organic heterojunctions, Applied Physics Letters, vol. 82, No. 26, Jun. 30, 2003, pp. 4815-4817.

B, A, Gregg et al., On the superlinear increase in conductivity with dopant concentration in excitonic semiconductors, Applied Physics Letters, vol. 84, No. 10, Mar. 8, 2004, pp. 1707-1709.

Jingsong Huang et al., Low-voltage organic electroluminescent devices using *pin* structures, Applied Physics Letters, vol. 80, No. 1, Jan. 7, 2002, pp. 139-141.

A. P. Kulkarni et al., Electron Transport Materials for Organic Light-Emitting Diodes, Chem. Mater. 2004, 16, pp. 4556-4573.

B. Maennig et al., Organic *p-i-n* solar cells, Appl. Phys. 2004, A 79, pp. 1-14.

Fenghong Li et al., Leuco Crystal Violet as a Dopant for n-Doping of Organic Thin Films of Fullerene $C_{60}$, J. Phys. Chem. B 2004, 108, pp. 17076-17088.

L. L. Miller et al., A Simple, Comprehensive Correlation of Organic Oxidation and Ionization Potentials, J. Org. Chem., 1972, vol. 37, No. 6, pp. 916-918.

A. Nollau et al., Controlled $n$-type doping of a molecular organic semiconductor: Naphthalenetetracarboxylic dianhydride (NTCDA) doped with bis(ethylenedithio)-tetrathialulvalene (BEDT-TTF), J. Appl. Phys., vol. 87, No. 9, May 1, 2006, pp. 4340-4343.

G. Parthasarathy, et al., Lithium doping of semiconducting organic charge transport materials, J. Appl. Phys., vol. 89, No. 9, May 1, 2001, pp. 4986-4992.

A. G. Werner, et al., Pyronin B as a donor for $n$-type doping of organic thin films, Applied Physics Letters, vol. 82, No. 25, Jun. 23, 2003, pp. 4495-4497.

A. J. Bard, L.R. Faulkner, Electrochemical Methods: Fundamentals and Applications, Wiley, 2nd Ed., 2000.

Akiba, Kin-Ya et al., "Direct Synthesis of 2,2-diaryl-3-methyl-2,3-dihydrobenzothiazoles from 3-methyl-2,3-dihydrobenzothiazole-2-thione and some mechanistic aspects," Bulletin of the Chemical Society of Japan, vol. 52(1), pp. 156-159, (1979).

Bach, U. et al. "Solid-state dye-sensitized mesoporous TiO2 solar cells with high photon-to-electron conversion efficiencies," Nature, vol. 395, Oct. 8, 1998, pp. 583-585.

Baumgartel, H. et al., "Polarographische Untersuchungen zur Konformation von 1.2.3.4.5-pentaarylimidazoliumkationen," Ber. Bunsenges (1972) 76/2, 94-100.

Baumgartel, H. et al.,"Uber eine neue Synthese von tetraaryl-imidazolen and pentaaryl-imidazolium-salzen," Chem. Ber. (1968), 101, 3504.

Curini, M. et al., "Ytterbium Triflate Promoted Synthesis of Benzimidazole Derivatives," Synlett, No. 10, pp. 1832-1834, 2004.

Deluca, Mark et al., "The p-toluenesulfonic acid promoted synthesis of 2-substituted benzoxazoles and benzimidazoles from diacylated precursors," Tetrahedron, vol. 53, No. 2, pp. 457-464, 1997.

Fild, Manfred et al. "Group VA pentafluorophenyl compounds. 14. Pentafluorophenyl-substituted phosphoranes," Zeitschrift Fuer Anorganische und Allgemeine Chemie, 439, pp. 145-152 (1978).

Gan, F. "Optical nonlinearity of hybrid and nanocomposite materials prepared by the Sol-Gel method," J. of Sol-Gel Science and Technology, 13, 559-563 (1998).

Giovanella, et al. "Electroluminescence from two fluorinated organic emitters embedded in polyvinyl carbazole," Applied Physics Letters, vol. 87, pp. 171910-1-3.

Grimmett, M. R., "Imidazole and benzimidazole synthesis," Tables of Contents, pp. 1-10, Academic Press, Harcourt Brace & Company, Publishers, London, San Diego, NY, Boston et al., 1997.

Gufeng, He et al., "High-efficiency and low-voltage p-i-n electrophosphorescent organic light-emitting diodes with double-emission layers," Applied Physics Letters, vol. 85, No. 17, Oct. 25, 2004, pp. 3911-3913.

Heinze, J. et al., "Polarographic studies of the conformation of 1,2,3,4,5-pentaarylimidazolium cations," The Institute for Physical Chemistry at the University of Freiburg, pp. 1-22, 1972.

Jefferson, Alan M. and Suschitzky, H., "New Route to Nucleophillically Substituted o-phenylenediamines," J.C.S. Chem. Comm. pp. 189-190, 1997.

Ludvik, J. and Pragst, F. et al., "Electrochemical generation of triplet states," Journal of Electroanalytical Chemistry, No. 180, pp. 141-156, (1984).

Muramatsu, T. et al, "Visible Light Sensitive Cyclomer and Its Tautomeric Dispiro Compound Formed from Bispyridiny Diradical," J. Am. Chem. Soc. 2005, 127, 4572-3.

Muramatsu, T. et al., "Photosensitive Cyclomer Formation of 1,1'-(1,2-ethanediyl)bis(pyridinyl) diradical and its derivativese," J. Am. Chem. Soc. 1989, 111, 5782-7.

Muramatsu, T. et al., "Preparation and Properties of a novel heterocyclic dispiro compound, 3, 10-diaza-N,N-dimethyldispiro[5,0,5.3]pentadeca-1,4,8,11-tetraene," Chemistry Letters, pp. 151-152, (1996).

Pfeiffer, M, et al., "Doped Organic semiconductors: physics and application in light emitting diodes," Organic Electronics: Elsevier, Amsterdam, NL, vol. 4, No. 2/3, Sep. 2003, pp. 89-103, XP001177135, ISSN: 1556-1199.

Quast, H. and Schmitt, E.; "Note Regarding the Quaternization of Heterocycles," Institute of Organic Chemistry at the University of Wurzburg, Chem, Ber. 101, pp. 4012-4014, (1968).

Schwarz, W. M. et al., "Formation of Stable Free Radicals on Electroreduction of N-alkylpyridium salts," J. Am. Chem. Soc., 33 3164 (1961).

Smith, M.B. Organic Synthesis, McGraw-Hill, Inc. 1994, Chapter 1.

Vaid T.P. et al, "Investigations of the 9,10-diphenylacridyl radical as an isostructural dopant for the molecular semiconductor 9,10-diphenylanthracene," Chemistry of Materials, American Chemical Society, Bd. 15, Nr. 22, 4292-4299 (2003).

Wintgens, V. et al., "Reduction of Pyrylium Salts: Study by ESR and UV_Visible Spectroscopy of the Reversible Dimerization of the Pyranyl Radical," New. J. Chem., 10/6, 345-350 (1986).

Zhou, X et al., "Enhanced hole Injection Into Amorphous Hole-Transport Layers of Organic Light-Emitting Diodes Using Controlled p-Type Doping," Adv. Funct. Mater., 2001, 11, No. 4, pp. 310-314.

English Translation of Japanese Office Action; Japanese Patent Application No. 2005-228491; Apr. 17, 2009.

International Search Report, International App. No. PCT/EP2007/002359, May 24, 2007.

Final Office Action, U.S. Appl. No. 11/688,777; Nov. 27, 2009.

Non-Final Office Action, U.S. Appl. No. 11/688,777; Feb. 2, 2009.

Response to Office Action, U.S. Appl. No. 11/688,777; Sep. 4, 2009.

Response to Office Action, U.S. Appl. No. 11/688,777; Aug. 3, 2009.

Notice of Allowance, U.S. Appl. No. 11/196,491: Apr. 13, 2009.

Notice of Allowance, U.S. Appl. No. 11/196,491; Oct. 20, 2008.

Response to Office Action for U.S. Appl. No, 11/196,491; Aug. 11, 2008.

Final Office Action, U.S. Appl. No. 11/196,491; Feb. 11, 2008.

Response to Office Action for U.S. Appl. No. 11/196,491; Nov. 5, 2008.

Non-Final Office Action, U.S. Appl. No. 11/196,491, Jul. 3, 2007.

International Search Report and Preliminary Report on Patentability for PCT/DE2008/001080; Jul. 11, 2008.

International Search Report for PCT/DE2008/00654; Jun. 15, 2009.

International Search Report and Preliminary Report on Patentability for PCT/EP2006/010816; Feb. 9, 2007.

Non-Final Rejection for U.S. Appl. No. 12/046,620; Nov. 25, 2009.

Response to Restriction Requirement for U.S. Appl. No. 12/046,620; Aug. 24, 2009.

Restriction Requirement for U.S. Appl. No. 12/046,620; Jul. 22, 2009.

Disclosure Under 37 C.F.R. 1.56 (submitted herewith).

Akutagawa, T. et al, "Multi Electron and Proton-Transfer System Based on 2,2'-biimidazole derivatives," Science and Technology of Syn. Metals, 1994, 346.

Alonso, R. A. et al. "Photostimulated Reaction of Diphenylarsenide and Diphenylstibide Ions with Haloaromatic Compounds by the Srn1 Mechanism. Electron Transfer vs. Bond Breaking of the Radical Anion Intermediate," J. Org. Chem. (1982) 47(1) pp. 77-80.

Auch et al. "Eine neue Synthese und die Kristallstrukturanalyse von., Krokonat-Blau . . . ," Chem. Ber. 120, 1691-1696 (1987), extract, pp. 1691-1693, 6 total pages.

Bamgboye, T.T. et a. "Lewis acidity of Ph2SbX3, wherein X = Cl or Br. Crystal structures of Ph2SbCl3*H20 and Ph2SbBr3*MeCN," J. of Organometallic Chem. vol. 362, Feb. 28, 1989, pp. 77-85.

Bard, A. J., Faulkner, R.J., Electrochemical Methods: Fundamentals and Applications, Wiley, 2nd Ed., 2000 (Chaper 6).

Barton, D.H.R. et al. "Comparative Arylation Reactions with Pentaphenylbismuth and with Triphenylbismuth Carbonate," J. Chem. Soc. Chem. Commun. (1980) 17, pp. 827-829.

Bhattacharya, S.N. et al. "Preparation & Characterization of Some Triarylarsenic & Triarylantimony Mixed Halides & Related Compounds," Indian J. Chem. 16A (1978) pp. 778-781.

Bonati, F. et al. "Reactions of C-imidazolyllithium derivatives with Broup Ib compounds: tris[micro-(1-alkylimidazolato-N3, C2)]tri-gold (I) and -silver (I)," J. Organomet. Chem. 1989, 375, pp. 147-160.

Brucsis, L. et al., "Substitutionasreaktionen an 1,4-dihalogen-2,3,5,6-tetracyan-benzolen," Chem. Ber. 109(1976) pp. 2469-2474.

Chonan et al. "The synthesis of difluoro and dimethyl derivatives of 2,6-bis(dicyanomethylene)-2,6-dihydro-4H-cyclopenta[2,1-b:3 ,4-b']-dithiophen-4-one (CPDT-TCNQ) and the Conducting Properties of the Metallic Salts Based on the Dimethy Derivative," The Chemical Society of Japan (2004) pp. 1487-1497.

Dedik, S.G. et al. "Tetrahalotetraazafulvalenes-new strong electron acceptors," Chemistry of Heterocyclic Compounds (A Translation of Khimiyageterotsiklicheskikh Soedinenii), Plenum Press Co., New York, U.S., vol. 10, Jan. 1, 1989, p. 1421.

Fatiadi et al. "Electrochemical Oxidation of Several Oxocarbon Salts in N,N-dimethylformamide," J. Electroanalytical Chem. (1982) vol. 135, pp. 193-209.

Fatiadi, "Psuedooxocarbons, Synthesis of 1,2,3-tris(dicyanomethylene)croconate Salts; A New Bond-Delocalized Dianion, Croconate Blue," J. Org. Chem. 1980, 45, 1338-1339.

Fatiadi, "Synthesis of 1,3-(dicyanomethylene)croconate Salts. New Bond-Delocalized Dianion, Croconate Violet," Journal of the American Chemical Society, Apr. 12, 1978, pp. 2586-2587.

Fausett, B.W. et al. "Palladium-catalyzed coupling of thiol esters with aryl and primary and secondary alkyl organiindium reagents," J. Org. Chem. (2005) 70(12) pp. 4851-4853.

Fukunaga, T. et al. "Negatively substituted trimethylenecyclopropane dianions," J. Am. Chem. Soc., 1976, pp. 610-613.

Gibbons, M.N. et al. "Multiply Bridged Diantimony Compounds," Phosphorus, Sulfur, & Silicon 93/94 (1994).

Glemser, O. et al. "Synthese von Tris-pentafluorphenylarsin, -stibin und—phosphin sowie von Trimethyl-pentafluor-phenylsilan," Angew. Chemie (1964) 76, 953.

Gogoi, P. et al. "An efficient and one-pot synthesis of imidazolines and benzimidazoles via anaerobic oxidation of carbon-nitrogen bonds in water," Tetrahedron Lett. 2006, 47, pp. 79-82.

Harada, K. et al. "Organic Homojunction Diodes with a High Built-in Potential: Interpretation of the Current-Voltage Characteristics by a Generalized Einstein Relation." Phys. Rev. Lett. 94, 036601 (2005).

Harada, Kentaro et al., "Realization of organic pn-homojunction using a novel n-type doping technique, Proceedings of SPIE—The international Society for Optical Engineering; Organic Optoelectronics and Photonics 2004," vol. 5464, Sep. 2004, pp. 1-9.

Harris, G. S. et al."The Reaction of Trispentafluorophenylstibine with Halogens and Interhalogens," J. Fluorine Chem. 37 (1987) pp. 247-252.

Hill, J. "Oxidative Dimerization of Benzimidazole," J. Org. Chem. 1963, 28, pp. 1931-1932.

Hopf et al. "Uber einen neuen Kohlenwasserstoff C18H24 . . . ," Helvetica Chimica Acta, vol. XLIV, Issue II (1961), No. 46, extract from p. 380-386.

Hopf et al., "Preparation and Properties, Reactions, and Applications of Radialenes," Angewandte Chemie, vol. 31, No. 8, Aug. 1992, pp. 931-954.

Iyoda, et al. "Novel synthesis of hexaaryl[3]radialenes via dibromo[3]dendralenes," Tetrahedron Letters 41 (2000), 6 pgs.

Japp, F. et al. "Constitution of Glycosine," J. Chem. Soc. Trans. 1887, 51, pp. 552-557.

Ji, L. et al. "Mono-, di- and tetra-nuclear ruthenium (II) complexes containing 2,2'-p-phenylenebis(imidazo[4,5-f]phenanthroline): synthesis, characterization and third-order non-linear optical properties," J. Chem. Soc., Dalton Trans. 2001, pp. 1920-1926.

Katz, H.E. et al., "Pyridyl Dicyanoquinodimethane Acceptors for Electroactive Solids," J. Org. Chem. 56 (1991) pp. 5318-5324.

Kikuchi, A et al. "A new family of pi-conjugated delocalized biradicals: electronic structures of 1,4-bis(2,5-diphenylimidazol-4-ylidene)cyclohexa-2,5-diene," J. Phys. Chem. B., 2005, 109, pp. 19448-19453.

Kikuchi, A. et al. "Definitive Evidence for the Contribution of Biradical Character in a Closed-Shell Molecule, Derivative of 1,4-Bis-(4,5-diphenylimidazol-2-ylidene)cyclohexa-2,5-diene," J. Am. Chem. Soc. 2004, 126, pp. 6526-6527.

Kimura, M. et al. "Preparation of 4-(4,5-diphenyl-1H-imidazol-2-yl)benzaldehyde and Its Practical Synthetic Use in the Synthesis of Unsymmetrically Substituted Imidazoles," ITE Letters on Batteries, New Technologies and Medicine, 2002, 3, pp. 30-34.

Koster, et al. "Synthesis and reactions of a tetraquinocyclobutane," Dept. of Chemistry, Univ. of Wisconsin, J. Org. Chem., vol. 40, No. 16, 1975, pp. 2300-2304.

Kozaki, M. et al. "Preparation, Properties, and Reduction of Heteroaromatic Quinoids with 1,4-diazacyclopentadien-2-ylidene Terminals," Org. Lett. 2005, 7, pp. 115-118.

Krebs, F.C. et al. "Superradiant properties of 4,4'-bis(1H-phenanthro[9,10-d]imidazol-2-yl)biphenyl and how a lase dye with exceptional stability can be obtained in only on synthetic step," Tetrahedron Lett. 2001, 42, pp. 6753-6757.

Lane, E.S. "A Modified Benziminazole Synthesis," J. Chem. Soc. 1953, pp. 2238-2240.

Lehmstaedt, K. et al. "Halogen-2,2'-diimidazole and ihre Umsetzungen mit Aminen zu Farbstoffen," Ber. Dt. Chem. Ges. B, 1943, pp. 879-891.

Leyden, R. et al. "Thermally Induced Degradation of 2,3,5,6-tetrachloroterephthalylidenebis(o-aminoaniline)," J. Org. Chem. 1983, 48, pp. 727-731.

Li, J. Y. et al. "Enhancement of green electroluminescence from 2,5-di-p-anisyl-isobenzofuran by double-layer doping strategy," Preparation and Characterization, vol, 446, No. 1, pp. 111-116.

Ludvik, J. and Volke, J. "Evidence for a radical intermediate in the anodic oxidation of reduced nicotinamide adenine dinucleotides obtained by electrogenerated chemiluminescence," Analytica Chimica Acta, 209 (1988) 69-78.

Matschke, M. et al. "Bis-4h-imidazoles-tetraazafulvalenes-2,2'-biimidazoles: three variations of one redox system," Tetrahedron, vol. 62, No. 36, Sep. 4, 2006, pp. 8586-8590.

Mayer, U. et al. "Uber 2,3,6,7-tetraphenyl-1,4,5,8-tetraazafulvale," Tetrahedron Lett. 1966, 42, pp. 5221-5223.

Mayer, U. et al, "Uber Biradikale, Chinone and Semichinone der Imidazolyl-Reihe," Angew. Chem. 1966, 78, p. 303.

Minoura, M. et al. "Hexaaryltellurium, the First Neutral Compounds Comprising Hexaarylated Elements," Angew. Chem. Int. Edit. 35 (22) pp. 2660-2662 (1996).

Miyasato, M. et al. "Syntheses and Reactions of Hexavalent Organitellurium Compounds Bearing Five or Six Tellurium-Carbon Bonds," Chem.-A European J. 10(10) pp. 2590-2600 (2004).

Okada, K. et al. "Detection of a diradical intermediate in the cis-trans isomerization of 5,5'-bis(4,5-diphenyl-2H-imidazol-2-yliden)-5,5'-dihydro-delta 2,2'-bithiphene," Tetrahedron Lett. 2006, 47, pp. 5375-5378.

Okada, K. et al. "Novel Dimers of 2,2'-(m-Phenylene)bis(4,5-diphenyl-1-imidazolyl) Diradical," Chem. Lett. 1998, pp. 891-892.

Otero, A. et a. "Pentachlorophenyl-arsenic, -antimony and -bismuth compounds," J. of Organometallic Chemistry, vol. 171, No. 3, Jan. 1, 1979, pp. 333-336.

Otero, A. et al. "Pentafluorophenylantimony compounds," J. Organometallic Chem. 154 (1978) pp. 13-19.

Ouchi, A. et al. "13C-nuclear magnetic resonance of some triaryl- and tri-alkylantimony and -bismuth derivatives," J. of Inorganic and Nuclear Chemistry, vol. 37, Issue 11, Nov. 1975, pp. 2347-2349.

Ouchi, A. et al. "The syntheses and properties of some alkylthioacetato and arylthioacetato derivatives of triphenylantimony(V) and -bismus (V)," J. of Inorganic and Nuclear Chemistry, vol. 37, Issue 12, Dec. 1975, pp. 2559-2561.

Park, S. B. et al. "Highly Efficient, Recyclable Pd(II) Catalysts with Bisimidazole Ligands for the Heck Reaction in Ionic Liquids," Organic Lett. 2003, 5, pp. 3209-3212.

Petzhold, C. "Beitrage zur Synthese funktioneller 1,4,5,8-tetraazafulvalene," Dissertation; Friedrich-Schiller-Universitat Jena; 2006.

Rake, A. T. et al. "Pentafluorophenyl and phenyl-phosphinidene ions and their group V analogues," Oms. Organic Mass Spectrometry, vol. 3 Jan. 1, 1970, pp. 237-238.

Rasmussen, P.G. et al. "Complexes of the New Ligand Tetracyanobiimidazole." J. Am. Chem. Soc. 1982, 104, pp. 6155-6156.

Rezende, M. C. et al. "An Alternative Preparation of Bisbenzimidazoles," Syn. Comm. 2001, 31, pp. 607-613.

Rezende, M. et al. "Puzzling Formation of Bisimidazole Derivatives from Hexachloroacetone and Diamines," Tetrahedron Lett. 1996, 37, 5265-5268.

Sakaino, Y. "Structures and Chromotropic Properties of 1,4-bis(4,5-diphenylimidazol-2-yl)benzene Derivatives," J. Org. Chem. 1979, 44, pp. 1241-1244.

Sato, S. et al. "Isolation and Molecular Structure of the Organo-persulfuranes [12-S-6(C6)]," J. Am. Chem. Soc. 128(21) pp. 6778-6779 (2006).

Schmidt, "Reaktionen von Quadratsaure und Quadratsaure-Derivaten," Synthesis, Dec. 1980, extract pp. 966, 24 total pages.

Schneiders, P. et al. "Notiz zur Darstellung von 4,4',5,5'-tetrasubstituierten Di-2-imidazolyl-derivaten. Ausgangsprodukte zur Darstellung von 1,4,5,8-tetraazafulvalenen," Chem. Ber. 1973, 106, pp. 2415-2417.

Seitz, G., Nachr. Chem. Tech. Lab 28 (1980), No. 11, extract pp. 804-807, total pp. 6: "Pseudooxokohlenstoffe."

Sekine, T. et al. "Dimerizations of pi-Rich N-heteroaromatic compounds and xanthine derivatives," Chem. Pharm. Bull. 1989, 37, pp. 1987-1989.

Singhal, K. et al. "One the Lewis acidity of tris(pentafluorophenyl)antimony (V) dichloride towards neutral monodentate O, N and S donor ligands," Journal of Fluorine Chemistry, vol. 121, No. 2, Jun. 1, 2003, pp. 131-134.

Sprenger, et al. "The cyclobutenediylium cation, a novel chromophore from squaric acid," Angew. Chem. International Edition, vol. 6 (1967), No. 6, pp. 553-554.

Suschitzky, H. "Syntheses and Reactions of 2,2'-bisbenzimidazole Systems," J. Heterocyclic Chem. 1999, 36, pp. 1001-1012.

Suzuki, T. et al., "4,7-bis(dimethylamino)benzimidazoles and twin-type derivatives: reversible two-stage redox system modulated by proton-transfer," Tetrahedron Lett. 2003, 44, pp. 7881-7884.

Takahashi et al. "Novel metallic charge-transfer complexes composed of a [3]radialene type acceptor: a 1,2-bis(p-benzoquino)-3-2-(dicyanomethylene) . . . " Advanced Materials, July, No. 7, 3 pgs.

Vyas, P.C. et al. "A simple synthesis of 2,2'-bis-benzimidazoles," Chem. Industry, 1980, pp. 287-288.

Weiss, M. "Acetic Acid-Ammonium Acetate Reactions. 2-Isoimidazoles as Intermediates in Imidazole Formation," J. Am. Chem. Soc. 1952, 74, pp. 5193-5195.

West, R. et al., "Diquinocyclopropanones, Diquinoethylenes, and the Anion-Radical and Free-Radical Intermediates in their Formation," Dept. of Chemistry, Univ. of Wisconsin, Feb. 24, 1975, pp. 2295-2299.

Yamaguchi, et al., "New Approaches to Tetracyanoquinodimethane," Bull. Chem. Soc. Jpn. 62 (1989) pp. 3036-3037.

Yamamoto, Y. et al. "The Electrical Properties of the Poly(N-vinyl Carbazole)-Antimony (V) Chloride (or Iodine) Charge Transfer Complexes," Bull. Chem. Soc. Jap. 1965, 38, 2015-2017.

Yoshiko, S., et al. "The Quinoid-biradical Tautomerism of 3,6-bis(4,5-diphenyl-2H-imidazol-2-ylidene)-1,4-cyclohexadiene," Nippon Kagaku Kaishi, 1972, 1, pp. 100-103.

Ziegenbein, W. "The cyclobutenediylium cation, a novel chromophore from squaric acid," Angew. Chem., 79:12, pp. 581-582 (1967).

Zimmerman, T. et al. "Benzocycloalkenone und dihydro-2H, 7H-1-benzopyranone aus 2,4,6-triaryl-pyryliumsalzen und cycloalkan-1,2-dionen," J. Prakt. Chem. 331 pp. 306-318 (1989).

Restriction Requirement, U.S. Appl. No. 11/688,777; Mar. 5, 2010.

Response to Restriction Requirement, U.S. Appl. No. 11/688,777; Apr. 1, 2010.

European Search Report for EP 07009366; Oct. 19, 2007.

International Search Report for PCT/EP2008/003792; Sep. 2, 2008.

Blinka et al. "Octacyanotetramethylenecyclobutane Dianioin and its Anion-Radical," Tetrahedron Lett. (1983). vol. 24, No. 1567-1568.

Blochwitz, J., et al., "Low voltage organic light emitting diodes featuring doped phthalocyanine as hole transport material," Applied Physics Letters, vol. 73, No. 6, Aug. 10, 1998, pp. 729-731.

Cherkashin M. I. et al. "Studies on 2,4,5-triarylimidazoles," Izv. Akad. Nauk SSSR, Seriya Khim. 1982, 2, pp. 376-377.

Takahashi et al. "Novel Electron Acceptors for Organic Condcutors: 1,2-Bis(p-benzoquino)-3[2-(dicyanomethylene)-2,5-thienoquino]cyclopropane Derivatives," J. Chem. Soc., Chem. Commun., 1994, pp. 519-520.

Yukihiko, T., et al. "Studies on Aromatic Nitro Compounds. V. A Simple One-Pot Preparation of o-Aminoaroylnitriles from Some Aromatic Nitro Compounds," Chem. Pharm. Bull., 33 (4) 1360-1366 (1985).

* cited by examiner

DOPED ORGANIC SEMICONDUCTOR MATERIAL

The invention relates to a doped organic semiconductor material with increased charge carrier density and effective charge carrier mobility.

Since organic light-emitting diodes and solar cells were demonstrated in 1989 ([C. W. Tang et al., Appl. Phys. Lett. 51 (12), 913 (1987)], there has been intensive research into circuit elements constructed from thin organic layers. Layers of this kind possess advantageous properties for the applications mentioned, such as efficient electroluminescence for organic light-emitting diodes, high coefficients of absorption in the range of visible light for organic solar cells, inexpensive production of the materials and manufacture of the circuit elements for very simple electronic circuits and the like. The use of organic light-emitting diodes for display applications has already acquired commercial importance.

The performance features of (opto-)electronic multi-layer circuit elements are determined by, among other things, the ability of the layers to transport the charge carriers. In the case of light-emitting diodes, the ohmic losses in the charge transport layers during operation are connected with the conductivity, which, on the one hand, has a direct influence on the operating voltage required, and, on the other hand, also determines the thermal load on the circuit element. In addition, depending on the charge carrier concentration of the organic layers, band bending occurs in the vicinity of a metal contact, which facilitates the injection of charge carriers and can thus reduce the contact resistance. In the case of organic solar cells too, similar considerations lead to the conclusion that their efficiency is also determined by the transport characteristics for charge carriers.

By doping hole transport layers with a suitable acceptor material (p-doping) or electron transport layers with a donor material (n-doping), the charge carrier density in organic solid state devices (and thus the conductivity) can be increased substantially. Furthermore, by analogy with the experience with inorganic semiconductors, applications can be expected which would be based specifically on the use of p and n-doped layers in a circuit element and which would not be conceivable in any other form. U.S. Pat. No. 5,093,698 discloses the use of doped charge carrier transport layers (p-doping the hole transport layer to add acceptor-like molecules, n-doping the electron transport layer by adding donor-like molecules) in organic light-emitting diodes. The use of doped charge carrier transport layers in organic solar cells is disclosed in, for example, Männig et al., Appl. Phys. A 79, 1 (2004).

The following approaches aimed at improving the conductivity of organic vapour-deposited layers are known so far:

1. increasing charge carrier mobility by
   a. using electron transport layers consisting of organic radicals (U.S. Pat. No. 5,811,833)
   b. creating highly ordered layers which permit optimum overlapping of the π orbitals of the molecules,
2. increasing the density of the movable charge carrier by
   a. purifying the materials and treating them gently in order to avoid the formation of charge carrier traps,
   b. doping organic layers by means of
   aa) inorganic materials (gases (J. Kaufhold et al., Ber. Bunsen. Phys. Chem. 69, 168 (1965), G. D. Sharma et al., Mater. Sci. Eng. B41, 222 (1996)), alkali or earth alkali atoms (R. C. Haddon et al., Nature 350, 320 (1991)), U.S. Pat. No. 6,013,384 (J. Kido et al.); J. Kido et al., Appl. Phys. Lett. 73, 2866 (1998), G. Parthasarathy et al. J. Appl. Phys. 89, 4986 (2201), inorganic Lewis acids, D. Oeter et al., Synthet. Met. 61, 147 (1993), C. Ganzorig et al., Chem. Lett. 1032 (2000), S. Hamm et al., J. Chem. Phys. 103, 10689 (1995), U.S. Pat. No. 6,423,429 (J. Kido et al.), J. Endo, Jpn. J. Appl. Phys. 41 (2002) L358),
   bb) organic materials (TNCQ (M. Maitrot et al., J. Appl. Phys., 60 (7), 2396-2400(1986)), F4TCNQ (M. Pfeiffer et al., Appl. Phys. Lett., 73 (22), 3202 (1998)), BEDT-TTF (A. Nollau et al., J. Appl. Phys., 87 (9), 4340 (2000)), pyronine B (DE 10307125, A. G. Werner et al., Appl. Phys. Lett., 82 (25), 4495), leuco crystal violet (F. Li et al., J. Phys. Chem. B, 108, 17076 (2004)), rhodamine B (B. Männig et al., Appl. Phys. A-Mat. Sci. Process 79, 1 (2004)), organic zwitter ions, B. A. Gregg et al. Appl. Phys. Lett. 2004, 84, 1708), organometallic complexes, WO03088271 (M. E. Thompson et al.)

Doped organic charge transport layers have already been used successfully to improve organic light-emitting diodes and solar cells. By doping the hole transport layer with the acceptor material F4TCNQ, a drastic reduction in the operating voltage of the light-emitting diode is achieved (X. Zhou et al., Appl. Phys. Lett., 78 (4), 410 (2001).). Similar success can be obtained by doping the electron-transporting layer with Cs or Li (J. Kido et al., Appl. Phys. Lett., 73 (20), 2866 (1998); J.-S. Huang et al., Appl. Phys. Lett., 80, 139 (2002)). Doping organic solar cells with the acceptor material F4TCNQ and rhodamine B leads to an improvement in the brightness characteristic, and above all to a higher short circuit current and a higher fill factor (B. Männig et al., Appl. Phys. A-Mat. Sci. Process 79, 1 (2004)).

Electric doping with inorganic materials suffers from the shortcoming that the small size of the atoms or molecules used means that they can easily diffuse into the circuit element and thus make clearly defined production difficult, e.g. achieving sharp transitions from p-doped to n-doped regions. In contrast to this, diffusion plays a subordinate role when large organic molecules are used as dopants. Their use is, however, impaired by the fact that potential doping molecules need to possess extreme electron affinity values for p-doping, or an extreme ionisation potential for n-doping. This is accompanied by a decline in the chemical stability of the molecules. Alkali metals or organometallic complexes are frequently not stable in air, since they are oxidised by the atmospheric oxygen. This then requires greater effort and expense in synthesising and handling the materials. The use of cationic dyes such as pyronine B or leuco crystal violet avoids this disadvantage by using precursor compounds which are stable in air, the dopant which is unstable in air then being released from the precursor compounds by a dissociation reaction in vacuo. This approach, however, has the disadvantage that, during the dissociation reaction, other molecular groups in addition to the dopant molecule are split off from the atoms, which may lead to unwanted side reactions in the doped layers. In the case of pyronine B or leuco crystal violet, for example, a hydrogen radical is split off, which can then add to matrix molecules. This can be expected, since some of the matrix molecules are present in a doped layer in the form of a radical ion.

In order to understand doping, it is useful to have some knowledge of the ionisation potentials (IP) and electron affinities (EA) of the materials involved in the solid phase. Ultraviolet photo-electron spectroscopy (UPS) is the method of choice in determining the ionisation potential (e.g. R. Schlaf et al., J. Phys. Chem. B 103, 2984 (1999). A related method, inverse photo-electron spectroscopy (IPES), is used to determine electron affinities (e.g. W. Gao et. al, Appl. Phys. Lett. 82, 4815 (2003), though it is less well-established. Alternatively, the solid-state potentials can be estimated by means of electrochemical measurements of oxidation potentials $E_{ox}$ or reduction potentials $E_{red}$ in the solution, e.g. by means of cyclovoltammetry (e.g. J. D. Anderson, J. Amer. Chem. Soc. 120, 9646 (1998)). Several publications provide empirical formulae for converting the electrochemical voltage scales (oxidation potentials) into the physical (absolute) energy scales (ionisation potentials), e.g. B. W. Andrade et al., Org. Electron. 6, 11 (2005); T. B. Tang, J. Appl. Phys. 59, 5 (1986); V. D. Parker, J. Amer. Chem. Soc. 96, 5656 (1974); L. L. Miller, J. Org. Chem. 37, 916 (1972), Y. Fu et al., J. Amer. Chem. Soc. 127, 7227 (2005). No correlation between the reduction potential and the electron affinity is known, since electron affinities are difficult to measure. For this reason, as a simple solution, the electrochemical and physical energy scales are calculated into each other via IP=4.8 eV+e×$E_{ox}$ (vs. ferrocene/ferrocenium) or EA=4.8 eV+e×$E_{red}$ (vs. ferrocene/ferrocenium), as described in B. W. Andrade, Org. Electron. 6, 11 (2005) (see also ref. 25-28 there). The conversion of different standard potentials or redox couples is described in, for example, A. J. Bard, L. R. Faulkner, "Electrochemical Methods: Fundamentals and Applications", Wiley, 2nd edition 2000.

From the above description, it thus becomes clear that it is at present not possible to determine precisely all the energy values, and that the values shown can merely be understood as rough guides.

It is an object of the present invention to provide a doped organic semiconductor material which overcomes the disadvantages of the prior art, and in particular a semiconductor material in which dopants with high chemical stability and low volatility can be used. A further object of the invention consists in ensuring that the dopants used do not split off any molecular groups during the doping process. In addition, an object of the invention consists in providing dopants which lead to a high thermal stability of the doped layer. A further object of the invention consists in doping organic matrix materials particularly efficiently. The dopants used should have a high molecular mass with a low vapour pressure at room temperature.

This object is achieved by a doped organic semiconductor material comprising an organic matrix material which is doped with at least one heteromonocyclic and/or heteropolycyclic compound, the compound having at least one nitrogen atom with a free electron pair.

The term "heteromonocyclic and/or heteropolycyclic compound" is intended also to encompass derivatives of such compounds, such as salts and adducts.

It is preferable for the dopant to be a (hetero)aromatic compound.

It is also preferable that the dopant should be acridine, phenazine and/or a derivative thereof. It goes without saying that doping with a mixture of appropriate dopants is also possible.

It is also preferable that the acridine derivative should be of the formula (1):

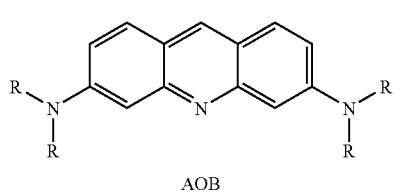

AOB where R is selected independently each time it occurs from alkyl, aralkyl, aryl and cycloalkyl.

It is particularly preferred for R to be methyl or ethyl.

The semiconductor material may also be characterised by a substitution in the 9 position, preferably selected from the group consisting of alkyl, aralkyl, aryl and cycloalkyl, especially phenyl.

One embodiment is characterised by the fact that the dopant is Lewis basic and that the molecular orbital involved in an acid-base reaction possesses σ character. The molecular orbital may optionally be non-bonding.

It is also proposed that the dopant should have a pKa value of between about 8.0 and about 14.0.

It is also preferred that the difference between the electron affinity of the organic matrix material and that of the ionisation potential of the dopant should be greater than 0.7 eV.

In addition, it is proposed that the organic matrix material should be an electron transporter.

In this context, it is preferable that the matrix material should be selected from fullerene, especially fullerene C60, 1,2,3,4,8,9,10,11,15,16,17,18,22,23,24,25-hexadecafluorophthalocyanine zinc, naphthalene tetracarboxylic acid dianhydride or mixtures thereof.

The dopant is preferably present in a doping ratio of between about 0.1 and about 20% based on a molecular numerical ratio relative to the matrix material.

It is particularly preferable for the doping ratio to be between about 2 and about 8%.

Finally, the dopant preferably has a sublimation temperature of at least about 90° C.

In order to produce the semiconductor material of the invention, the doped matrix material may be deposited from the solution or from the gas phase.

It has surprisingly been found that, by doping an organic matrix material in accordance with the invention, preferably with acridine, phenazine and/or derivatives thereof, especially 3,6-bis-(dimethyl amino)-acridine, a considerable increase in conductivity compared to non-doped matrix material can be achieved. A doped organic semiconductor material in accordance with the present invention comprises dopants with high chemical stability and low volatility. In particular, no molecular groups are split off during the doping process, which can lead to unwanted by-products. The thermal stability of the doped layer is also high. Fullerene C60 has proven particularly preferable as a matrix material. This is a case of n-doping.

In the light of the conventional idea of the doping process, in particular the doping effect of acridine and its derivatives, especially in fullerene C60, is difficult to understand because of the poor capacity of these organic doping molecules for oxidation (for 3,6-bis-(dimethyl amino)-acridine, the figure is $E_{ox}$=0.8 V vs. SCE (standard calomel electrode), corresponding to 1.0 V vs. SHE (standard hydrogen electrode), or IP=5.6 eV). For this reason, acridine and its derivatives should not really be capable of transferring a negative charge to fullerene C60. By way of comparison, the oxidation potential of bisethylene dithia-tetrathiafulvalen (BEDT-TTF) is given as: $E_{ox}$=0.43 V vs. SCE, corresponding to IP=5.2 eV. Despite the considerably lower oxidation potential, BEDT-TTF as the dopant in the NTCDA matrix yields lower conductivities than acridine derivatives, as can be seen from the examples and comparative examples provided below.

In addition the reduction potentials of fullerene C60 ($E_{red}$=−0.98V vs. Fc/Fc$^+$, corresponding to −0.54V vs. SCE) and NTCDA (−0.29V vs. SCE (S. F. Nelsen, J. Amer. Chem. Soc. 89, 5925 (1967)) are provided. It is apparent that the difference between the reduction potential of the matrix (NTCDA) and the oxidation potential of the dopants (3,6-bis-(dimethyl amino)-acridine) can amount to 1.09 V and that there will still be a sufficient doping effect. With conventional dopants (BEDT-TTF, see above), on the other hand, even with a difference of 0.7 V only a weak doping effect is found.

Without wishing to be bound by a particular theory, it is assumed that for the doped organic semiconductor material of the invention, the good doping effect is based on the Lewis basicity of the dopants used, i.e. in the provision of a free electron pair.

According to Lewis, a Lewis base is a molecule which possesses a free electron pair and can donate it. A Lewis acid is a molecule which possesses an unoccupied molecular orbital and can accept an electron pair.

Klopman (G. Klopman, Chemical Reactivity and the Concept of Charge- and Frontier-controlled Reactions, J. Am. Chem. Soc., 90:2, 223-234 (1968)) expanded the terms "Lewis base" and "Lewis acid" to the effect that a Lewis base is a molecule that can donate an electron pair or which possesses an available highest occupied molecular orbital (HOMO). A Lewis acid, on the other hand, possesses a vacant orbital or an energetically low-lying unoccupied molecular orbital (LUMO). Lewis acids and Lewis bases can then react together as a result of the interaction of their orbitals with a Lewis base character and Lewis acid character, forming a common molecular orbital in the process.

A more precise classification of Lewis bases is made in, for example, W. B. Jensen, "The Lewis Acid-Base concepts", John Wiley & Sons, New York 1980. According to that publication, Lewis bases can be classified into n (non-bonding), σ (bonding with σ symmetry) and π (bonding with π symmetry), depending on the types of the molecular orbital involved in the acid-base reaction. The orbitals concerned are frequently, though not necessarily, the frontier orbitals.

Conventional dopants for n-doping are generally regarded as electron donors, which donate one or more electrons to reaction partners in the course of a redox reaction (e.g. the matrix molecules). This is made possible by a low ionisation potential of the dopants (<5.2 eV). Donors may be radicals (e.g. crystal violet radical) or may have closed shells (e.g. tetrathia-fulvalen). In some situations, the latter may also act as Lewis bases, for example in the formation of charge-transfer complexes. According to the classification provided above, these compounds must then be included among the π Lewis bases. The distinction as to whether a molecule appears as a π donor, or as a π Lewis base, is made on the basis of whether any interaction between the orbitals occurs during the reaction with the acceptor, or the acid.

What is now new is that even Lewis bases which do not exhibit any electron donor properties can also be used as dopants for n-doping. In particular, these Lewis bases often possess a very high ionisation potential of >5.2 eV and can thus be distinguished from conventional dopants. Nevertheless, a doping effect, namely an increase in the conductivity and the electron density, is found. The high ionisation potential has the advantage that novel dopants of this kind can be stable in air.

As a particular property of the novel class of materials, it has been found that the doping effect is substantially obtained only under the influence of irradiation with light or heat. In conventional dopants, on the other hand, the doping effect is already achieved in the dark at room temperature. Using the novel dopants makes it possible to adjust the conductivity in a doped layer to different lateral extents. For example, the doped layer can be illuminated through a mask. Regions which are not shaded by the mask thus obtain a higher conductivity than regions which are shaded by the mask. For example, strip conductors can be structured in the doped layer in this way. Without wishing to be bound by a particular theory, it is believed that the organic matrix molecules and the dopant can arrange themselves, when there is an input of energy or heat, in such a way that the molecular orbitals involved in the doping reaction have a favourable spatial arrangement towards one another.

The base characteristic of AOB, for example, can also be seen from the fact that AOB reacts with the proton of an acid to form acridine orange, the proton being attached to the nitrogen of the acridine. This likewise characterises the σ character of the molecular orbital establishing the Lewis basicity.

The inventors have found that such salts or adducts of Lewis bases (e.g. acridine or phenazine derivatives) or Lewis acids (proton, for example) can likewise be used for doping. In the case of the joint evaporation of acridine orange (counter-ion: chloride) with fullerene C60, increased conductivity is also found. This is attributed to the fact that the salt dissociates during sublimation or evaporation and substantially releases the underlying Lewis base; in the present case, AOB is released from acridine orange.

The dopants used in accordance with the invention exhibit high chemical stability. It is possible to store the purified material in air for several months without any degradation becoming apparent. In contrast to this, for example, the cobaltocene used as an n-dopant must be stored under inert conditions. In addition, the dopants used in accordance with the invention have a low vapour pressure. To sublime the dopants, it is advantageous to employ a temperature of >90° C., preferably >120° C., and in particular >150° C.

The dopants used in accordance with the invention can often be sublimed or evaporated undecomposed. It is thus possible to purify these dopants by gradient sublimation or fractional sublimation, which is necessary for the production of organic electronic circuit elements.

Examples of organic matrix materials that can be used are fullerenes, such as C60, oxadiazole derivatives, such as 2-(4-biphenyl)-5-(4-tert-butylphenyl)-1,3,4-oxadiazole, triazole derivatives, such as 3-(4-biphenylyl)-4-phenyl-5-tert-butylphenyl-1,2,4-triazole, quinoxaline-based compounds such as bis(phenyl quinoxalines), metal complexes, such as tris(8-hydroxyquinoline)-aluminium, phenanthroline derivatives, such as bathocuproine, or oligothiophenes, perylene derivatives, such as perylene tetracarboxylic anhydride, naphthalene derivatives, such as naphthalene tetracarboxylic anhydride, polymers such as polypyridine or polypyridine vinylene or other electron transport materials, such as those described in, for example, A. P. Kulkarni et al., Chem. Mater. 2004, 16, 4556.

Other features and advantages of the semiconductor material of the invention will become apparent from the following examples of preferred embodiments.

EXAMPLE 1

3,6-bis-(dimethyl amino)-acridine in Fullerene C60

A substrate with contacts made of silver is cured for at least 30 minutes at 120° C. at a pressure of $10^{-6}$ mbar. After the substrate has cooled to room temperature, a mixed layer of 3,6-bis-(dimethyl amino)-acridine and fullerene C60 is deposited on the substrate by joint evaporation. The rates of the two substances are controlled by one oscillation quartz each and adjusted such that a doping ratio of 5% acridine derivative in fullerene C60 (molecular numerical ratio) results on the substrate. During the vapour deposition process, the light of a halogen lamp is irradiated into the vacuum chamber. If necessary, the layer is heated briefly to 70° C. in order to achieve a further increase in conductivity. The total thickness of the layer is 50 nm. The conductivity of the layer is determined by measuring the current when a voltage of 10V is applied to the Ag contacts, taking account of the contact geometry. The conductivity is $2 \times 10^{-2}$ S/cm at room temperature.

The conductivity of undoped layers is less than $10^{-8}$ S/cm as a rule. As a result of the doping, a conductivity of $>10^{-8}$ S/cm, preferably $>10^{-6}$ S/cm, particularly preferably greater $>10^{-5}$ S/cm is achieved.

To determine the charge carrier concentration, thin layers with varied doping concentrations were deposited according to the same process. The substrates used consist of doped silicon as the gate electrode, an insulating layer formed thereon and consisting of 90 nm silicon oxide and gold contacts applied to the side of the insulating layer opposite the gate electrode. The latter form the source and drain contacts. A thin-layer field effect transistor structure of this kind makes it possible to determine the mobility of the charge mobility (see, for example, A. G. Werner et al., Appl. Phys. Lett., 82 (25), 4495). From the conductivity and mobility measured, one obtains the charge carrier density which arises as a result of doping the fullerene C60. The electron density rises monotonously with the increasing doping concentration from about $1.5 \times 10^{-18}$ cm$^{-3}$ to $1.5 \times 10^{-19}$ cm$^{-3}$, with the doping concentration varying from 2% to 17

COMPARATIVE EXAMPLE 1

Undoped Fullerene C60

Comparative Example 1 was carried out by analogy with Example 1, but without blending in 3,6-bis-(dimethyl amino)-acridine. The conductivity was $10^{-8}$ S/cm.

EXAMPLE 2

3,6-bis-(dimethyl amino)-acridine in Naphthalene Tetracarboxylic Acid Di-Anhydride (NTCDA)

Example 2 was carried out in accordance with Example 1, but instead of fullerene C60, NTCDA was used as the matrix material. The conductivity was $10^{-5}$ S/cm.

COMPARATIVE EXAMPLE 2a

Undoped NTCDA

Comparative Example 2 was carried out by analogy with Example 2, but without blending in the acridine derivative. The conductivity was $10^{-8}$ S/cm.

COMPARATIVE EXAMPLE 2b

BEDT-TTF in NTCDA

Comparative Example 2b was carried out by analogy with Example 2, but BEDT-TTF was used as the dopant instead of 3,6-bis-(dimethyl amino)-acridine. The conductivity was $4 \times 10^{-6}$ S/cm

EXAMPLE 3

9-phenyl Acridine in Fullerene C60

A substrate with contacts made of indium-tin oxide was cured for at least 30 minutes at 120° C. at a pressure of $10^{-6}$ mbar. After the substrate had cooled to room temperature, a mixed layer of 9-phenyl acridine and fullerene C60 was deposited on the substrate by joint evaporation. The rates of the two substances were controlled by one oscillation quartz each and adjusted such that a doping ratio of 5% 9-phenyl acridine in fullerene C60 (molecular numerical ratio) resulted on the substrate. During the vapour deposition process, the light of a halogen lamp was irradiated into the vacuum chamber. The total thickness of the layer was 50 nm. The conductivity of the layer was determined by measuring the current when a voltage of 10V was applied to the ITO contacts, taking account of the contact geometry. The conductivity was $3 \times 10^{-5}$ S/cm.

COMPARATIVE EXAMPLE 3

9-phenyl Anthracene in Fullerene C60

Comparative Example 3 was carried out by analogy with Example 3, except that, instead of 9-phenyl acridine, 9-phenyl anthracene was used as the dopant. The conductivity was $5 \times 10^{-7}$ S/cm.

It is apparent from Example 3 and Comparative Example 3 that 9-phenyl acridine as the dopant leads to an increase in the conductivity of a fullerene C60 matrix. 9-phenyl anthracene has a similar chemical structure, but does not produce an increase in conductivity. The two molecules have a similar electronic structure and differ only in a nitrogen atom in the middle ring system. The basic character of this ring nitrogen is apparently the reason for the doping effect observed, because of the free electron pair on it. Molecules with such a nitrogen function, or, more generally, Lewis bases with a σ character of the basic molecular orbital, thus form a new class of dopants for the n-doping of organic materials.

EXAMPLE 4

Acriflavine Neutral in Fullerene C60

Example 4 was carried out in accordance with Example 1, except that acriflavine neutral was used as the dopant. The structure of acriflavine neutral (3-amino-7-dimethyl amino-2-methyl phenacine hydrochloride) is shown below:

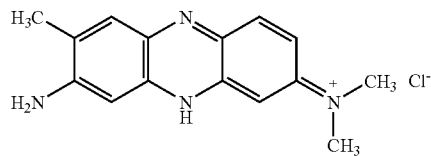

Structure of acriflavine neutral.

The conductivity was 1 S/cm.

The features of the invention disclosed in the present description and in the claims can be essential to implementing the invention in its various embodiments both individually and in any combination.

The invention claimed is:

1. A doped organic semiconductor material comprising an organic matrix material which is electrically doped with at least one acridine derivative, the compound having at least one nitrogen atom with a free electron pair, wherein the dopant has a pKa value of between about 8.0 and about 14.0, wherein the organic matrix material is an electron transporter, and wherein the matrix material is selected from fullerene, 1,2,3,4,8,9,10,11,15,16,17,18,22,23,24,25-hexadecafluo-rophthalo-cyanine zinc, naphthalene tetracarboxylic acid di-anhydride, or any combination thereof; and wherein the acridine derivative is of the formula (I):

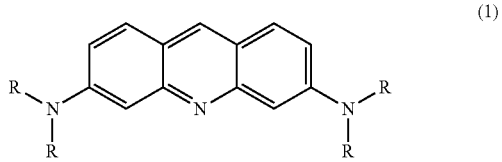

wherein R is selected independently each time it occurs from alkyl, aralkyl, aryl, or cycloalkyl.

2. The semiconductor material as claimed in claim 1, wherein R is independently selected from methyl or ethyl.

3. A doped organic semiconductor material comprising an organic matrix material which is electrically doped with at least one heteromonocyclic or heteropolycyclic aromatic compound, the compound having at least one nitrogen atom with a free electron pair, wherein the dopant comprises acridine, phenazine, or a derivative thereof, and wherein the dopant is substituted in the 9 position by a substituent selected from the group consisting of alkyl, aralkyl, aryl, and cycloalkyl; and wherein the matrix material is selected from fullerene, 1,2,3,4,8,9,10,11,15,16,17,18,22,23,24,25-hexa-decafluorophthalo-cyanine zinc, naphthalene tetracarboxylic acid di-anhydride, or any combination thereof.

4. The semiconductor material as claimed in claim 1, wherein the dopant is Lewis basic and the molecular orbital involved in an acid-base reaction possesses σ character.

5. The semiconductor material as claimed in claim 1, wherein the difference between the electron affinity of the organic matrix material and that of the ionisation potential of the dopant is greater than 0.7 eV.

6. The semiconductor material as claimed in claim 1, wherein the dopant is present in a doping ratio of between about 0.1 and about 20% based on a molecular numerical ratio relative to the matrix material.

7. The semiconductor material as claimed in claim 6, wherein the doping ratio is between about 2 and about 8%.

8. The semiconductor material as claimed in claim 1, wherein the dopant has a sublimation temperature of at least about 90° C.

9. The semiconductor material as claimed in claim 1, wherein the matrix material is selected from fullerene $C_{60}$.

10. The semiconductor material as claimed in claim 3, wherein the dopant is Lewis basic and the molecular orbital involved in an acid-base reaction possesses σ character.

11. The semiconductor material as claimed in claim 3, wherein the difference between the electron affinity of the organic matrix material and that of the ionisation potential of the dopant is greater than 0.7 eV.

12. The semiconductor material as claimed in claim 3, wherein the dopant is present in a doping ratio of between about 0.1 and about 20% based on a molecular numerical ratio relative to the matrix material.

13. The semiconductor material as claimed in claim 12, wherein the doping ratio is between about 2 and about 8%.

14. The semiconductor material as claimed in claim 3, wherein the dopant has a sublimation temperature of at least about 90° C.

\* \* \* \* \*